United States Patent
Schneider et al.

(10) Patent No.: US 7,451,698 B2
(45) Date of Patent: Nov. 18, 2008

(54) DEVICE FOR PRODUCING A COATING ON PRINTED PRODUCTS FROM A PRINTING PRESS

(75) Inventors: Josef Schneider, Diedorf (DE); Rainer Stamme, Augsburg (DE); Michael Schönert, Augsburg (DE)

(73) Assignee: manroland AG, Offenbach (DE)

( * ) Notice: Subject to any disclaimer, the term of this patent is extended or adjusted under 35 U.S.C. 154(b) by 16 days.

(21) Appl. No.: 11/034,609

(22) Filed: Jan. 13, 2005

(65) Prior Publication Data
US 2005/0193911 A1 Sep. 8, 2005

(30) Foreign Application Priority Data
Jan. 15, 2004 (DE) .......... 10 2004 002 132

(51) Int. Cl.
*B41F 31/08* (2006.01)
(52) U.S. Cl. .................. 101/424.2; 101/424.1
(58) Field of Classification Search ........... 101/424.2, 101/491, 424.1; 347/102, 21, 22, 73
See application file for complete search history.

(56) References Cited

U.S. PATENT DOCUMENTS

| | | | |
|---|---|---|---|
| 4,314,259 A * | 2/1982 | Cairns et al. ............ | 347/75 |
| 4,766,840 A * | 8/1988 | Beckley et al. .......... | 118/46 |
| 5,168,811 A * | 12/1992 | Cox et al. ............... | 101/424.1 |
| 5,638,752 A * | 6/1997 | Hartung et al. .......... | 101/177 |
| 5,776,619 A * | 7/1998 | Shanton ................. | 428/511 |
| 5,906,156 A | 5/1999 | Shibuya et al. | |
| 6,039,356 A | 3/2000 | Warther et al. | |
| 6,095,050 A * | 8/2000 | Figov .................. | 101/483 |
| 6,454,405 B1 | 9/2002 | Stowe | |
| 6,505,557 B2 * | 1/2003 | Desaulniers et al. ..... | 101/487 |
| 6,550,905 B1 * | 4/2003 | Deckers ................ | 347/100 |

(Continued)

FOREIGN PATENT DOCUMENTS

DE 2704514 C2 8/1977

(Continued)

OTHER PUBLICATIONS

Search report in counterpart European Patent Application No. 0500365.6-1251.

*Primary Examiner*—Anthony H. Nguyen
(74) *Attorney, Agent, or Firm*—Leydig, Voit & Mayer, Ltd.

(57) ABSTRACT

A device for producing a coating on printed products from a printing press is provided. The coating device can be actuated digitally via printing image data thereby allowing the coating motif to be designed in a variable manner The coating device can include an inkjet printer in the form of an inkjet head array or an inkjet head bar acting as a varnishing unit that operates line-by-line on large-format printing material. The coating device can also be integrated in a rotary press having a varnishing unit for coating a printing material that has been processed in the printing press. The coating device can also be integrated with a dryer. The printing material can be passed under the outlet openings of the inkjet heads and the dryer can be arranged directly after the inkjet printer in the transport direction of the printing material in order to dry the liquid coating material on the printing material after the application.

14 Claims, 6 Drawing Sheets

U.S. PATENT DOCUMENTS

| | | |
|---|---|---|
| 2001/0042472 A1 | 11/2001 | Muller et al. |
| 2003/0142343 A1* | 7/2003 | Bezenek .................... 358/1.15 |
| 2003/0218663 A1* | 11/2003 | Baxter et al. ................ 347/102 |
| 2004/0189774 A1 | 9/2004 | Uejima |

FOREIGN PATENT DOCUMENTS

| | | |
|---|---|---|
| EP | 0680832 A1 | 11/1995 |
| EP | 1008449 A1 | 6/2000 |
| EP | 1186439 A1 | 3/2002 |
| WO | WO 2004/106073 A1 | 12/2004 |

* cited by examiner

Fig. 1: Inkjet print head configuration

Fig. 2: Inkjet print head bar configuration

Fig. 3: Inkjet coating unit configuration for sheet-fed offset printing presses

Fig. 4: Inkjet coating unit configuration for web-fed printing presses (for example, offset)

Fig. 5: Inkjet coating unit configuration for sheet-fed coating presses

Fig. 6: Inkjet coating unit configuration for web-fed digital printing presses Unwinder  Digital Web Fed Print engine  Delivery

Fig. 7: Inkjet coating unit configuration for sheet-fed digital printing presses Feeder  Delivery Fig. 8: Inkjet coating by means of variable amount metering Fig. 9: Inkjet coating as profile on the printing material Fig. 10: Inkjet coating unit configuration for web-fed digital printing presses Fig.11: Inkjet coating unit
(Inkjet head and drying system

DEVICE FOR PRODUCING A COATING ON PRINTED PRODUCTS FROM A PRINTING PRESS

FIELD OF THE INVENTION

The invention generally relates to printing presses and, more particularly to devices for producing a coating on printed products from a printing press.

BACKGROUND OF THE INVENTION

Rotary printing presses including varnishing devices and dryers that are arranged after the varnishing devices are known from the prior art. The dryers dry the printing material that has been varnished in the varnishing devices is dried, are known from the prior art. Thus, for example, in sheet-fed rotary offset presses, the sheets that have been printed in the printing units are covered with a varnish layer in a varnishing unit that is connected after or downstream of the printing units. The sheets are subsequently guided past a known dryer device in the form of an infrared, hot-air or UV dryer, in which the varnished sheets are dried before being deposited on a deliverer stack. The purpose of known varnishing units is increasing the rubbing resistance and the gloss of printed products or preventing ink from being deposited in the stack in the event of a very thin application of varnish. The varnishing is usually performed in the final printing units.

A free inking unit can be the simplest way to varnish printed products. In such a case, as is known, a special heat-set ink is used that can be processed like a normal heat-set ink. The special heat-set ink is transferred onto the surface of the paper wet-on-wet together with the printing ink and then dried in heat-set dryers. Special varnishing units are also available to meet the ever-increasing quality requirements associated with web-fed offset printing. The special varnishing units are positioned between the final printing unit and the heat-set dryer. Varnishing operations can be performed with aqueous emulsion varnishes. Most emulsion varnishes are dried through physical evaporation of the water. However, in web-fed offset printing, a special UV drying system (UV radiant heater) can be used that is capable of performing not only the drying of the printing ink, but also partial UV varnishing. Special UV varnishes that are applied to 100% polymerizable binder constituents are used.

Inkjet technology is in widespread use in both home PC printers as well as industrial applications such as digital proof systems that use the data of an ESP system directly with digital printers. For the home and office, a wide variety of printer manufacturers are known that are capable of producing relatively high-quality (generally >1200 dpi), multi-color prints. Such printers are usually designed for personal use. In other words, the printers are actuated by a PC and can be used with a variety of printing materials. The disadvantages of home and office printers generally include slow printing speeds (low number of printed copies per unit time) and the relatively high cost of the printing inks. As will be appreciated, home/office inkjet printers are not suitable for industrial applications.

Inkjet printing systems for industrial printing applications are also known. For example, inkjet systems can be used to produce proofs, to set images on printing plates or printing forms. Inkjet systems can also be used for digitally printing small special runs (for example, printing structural shapes) and special formats (for example, large-format posters or textiles). In a similar manner to home/office inkjet printing applications, industrial applications predominantly use inkjet printing systems for very small print runs and that the costs for printing inks are very high. As compared to conventional printing methods such as offset and gravure, inkjet printing is not economical for printing large runs, as inkjet printing is very slow at high print resolutions (>1200 dpi). At low print resolutions (<300 dpi), inkjet printing is capable of providing a relatively high number of printed copies per unit time, but at the expense of satisfactory print quality.

Up to now, coating, varnishing or finishing of conventionally printed products (for example, offset or gravure printed products) or of digitally printed products (for example, photoelectric printing) has been performed using conventional coating, varnishing or finishing methods, as has been described above. These can be methods for flexographic printing, gravure printing or offset printing. Additionally, there are coating methods that are performed by means of lamination (for example, adhesive bonding of films or other carrier materials). These methods are likewise used predominantly for finishing and to protect the surface of the printed products.

As also discussed above, water-based varnishes and UV varnishes are mainly used when varnishing printed products. The varnishing procedures can be performed over the entire area or only on sub-areas. In such a case, conventional coating methods are particularly suitable for large print runs and high quality requirements.

BRIEF SUMMARY OF THE INVENTION

In view of the foregoing, an object of the invention is providing a device for producing a coating on printed products from a printing press that advantageously can be actuated digitally via so-called printing image data thus allowing the coating motif to be designed in a variable manner.

Inkjet printing is a printing technology that is categorized as a non-impact printer. This is understood to mean a contact-less printing method, in which a minuscule amount of ink is fired onto the printing material from one or more extremely small nozzles in an electronically controlled manner (as is described, for example, in DE 27 04 514 C2). The inkjet printing techniques are subdivided into "continuous jet" and "drop on demand" techniques. The advantage of contact-less printing methods is that if required it is possible to omit upstream drying methods, thereby saving energy and material costs.

Furthermore, as has already been mentioned, the inkjet printing method can be actuated digitally via what is known as printing image data. Thus, it is possible to design the printed image or the coating motif in a variable manner. In conventional coating methods (for example, flexographic printing, gravure printing or laminating methods), the coating motif is predefined in a fixed manner and can not be varied. Once a motif has been defined, it cannot be changed from what is known as a master form. These conventional master forms are usually very expensive and defined only for a specific printing or coating application. The use of conventional master forms is often not economical for small job sizes or printing or coating jobs that change frequently, as the one-off costs for the forms are very high with regard to the small job size.

Smaller and special print runs (for example, personalized or individualized print runs) are characteristic of digital printing. In the majority of such digital printing applications have a print-run range of between 10 and 500 copies. A further characteristic of digital printing is short production times. In particular, the time for processing printed products is greatly reduced as compared with conventional printing processes.

The long manufacturing times associated with conventional coating forms cannot be justified for digital printing applications.

The inkjet coating method of the present invention is thus specifically suitable for every type of digital printing and for every printing method. More specifically, the present invention can be used advantageously both in every rotary press and in digital, image data-oriented printing presses, in particular inkjet printing presses.

The inkjet printing method does not require a master form in order to perform printing or coating. The inkjet nozzles can be actuated variably by means of digital data, with the result that a coating motif can be changed flexibly and on demand. With the inkjet printing method, the printing or coating motifs can be changed by changing any forms "online", that is to say through direct interaction with a control unit without any time loss. No costs are incurred for the manufacture and the exchange of forms for printing or for coating.

Further advantages of using the inkjet printing method for printing or coating are achieved through the ability of the inkjet to distribute the amount of liquid coating material (for example, varnish) variably. In addition to a variable, motif-based distribution on the substrates that are to be coated, it is also possible to vary the amount of coating material distributed by means of the inkjet and digital image data. This additional property enables the production of what are known as layer profiles having different coating thicknesses. For example, coatings can be differentiated according to text, images and backgrounds not only by the motif, but they can also be differentiated in profile. This also extends the usefulness of inkjet coating processes to the impression and aesthetics of printed products, in addition to the actual functions (surface protection and gloss).

Special inks (for example, luminescent inks) or functional materials (for example, electronic polymer materials for electrical conduction functions) can be transferred by the inkjet coating method of the present invention, in addition to varnishes with a protective action (for example, abrasion protection) and finishing action (for example, gloss). Such special inks or materials can be applied by means of an inkjet over the whole area or advantageously only partially (for example, text, codes, symbols) in accordance with their function. The special inks or functional materials can be used, for example, for labeling products in the security or packaging sectors by coating the products themselves or by coating labels. For example, invisible inks can be printed that are visible only under UV light thereby fulfilling a security function. Conductive elements that can serve for registration functions can be transferred by the application of electronic polymer materials.

The inkjet printing or coating unit for coating printed products can be integrated into existing printing presses or into newly designed printing presses. The inkjet printing or coating unit can be used with both sheet-fed printing presses and web-fed printing presses. The use of the inkjet method for coating printed products is not dependent on the printing methods used to manufacture the printed products which are to be coated. It is possible to coat both printed products that are manufactured by means of conventional printing methods (for example, offset, flexographic or gravure printing) and products which are manufactured by means of digital printing (for example, photoelectric printing, xerography).

DETAILED DESCRIPTION OF THE INVENTION

Figure 1:
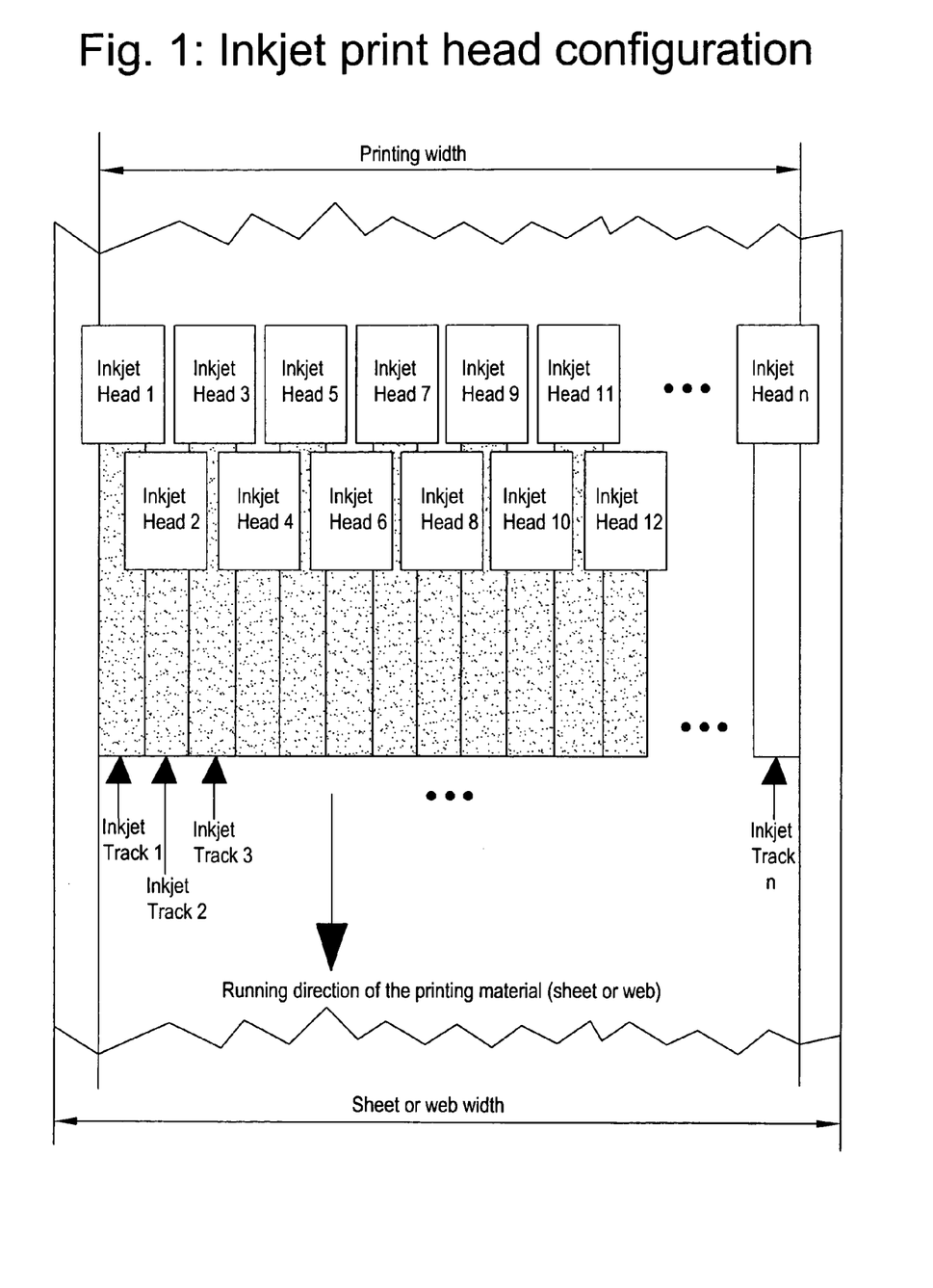
FIG. 1 is a schematic view of an exemplary coating unit according to the present invention including an inkjet head array.
Figure 2:
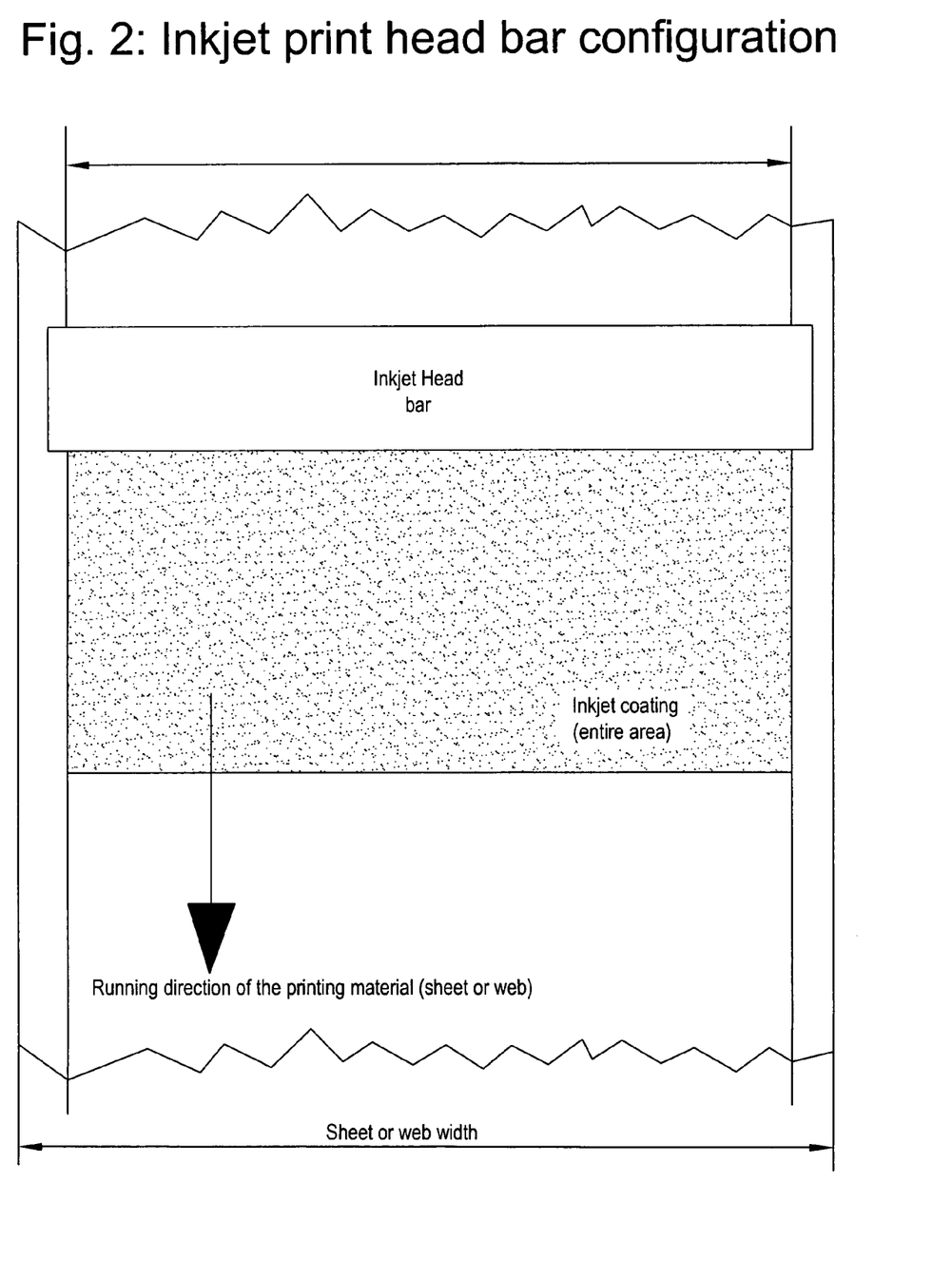
FIG. 2 is a schematic view of an exemplary coating unit according to the present invention including an inkjet print head bar.

Referring now to the drawings, an inkjet coating unit according to the invention can be arranged in the form of an inkjet head array (a multiple head arrangement) such as shown in FIG. 1 or an inkjet head bar such as shown in FIG. 2. The inkjet head array or the inkjet head bar should be arranged to ensure the complete coverage of the printed product which is to be coated. Thus, it should be possible to coat the entire area of the printed product. The printed product which is to be coated is passed under the outlet openings of the inkjet heads in the arranged configuration. As a result, the printed product is able to receive and be coated by the liquid coating material (for example, varnish).

Figure 11:
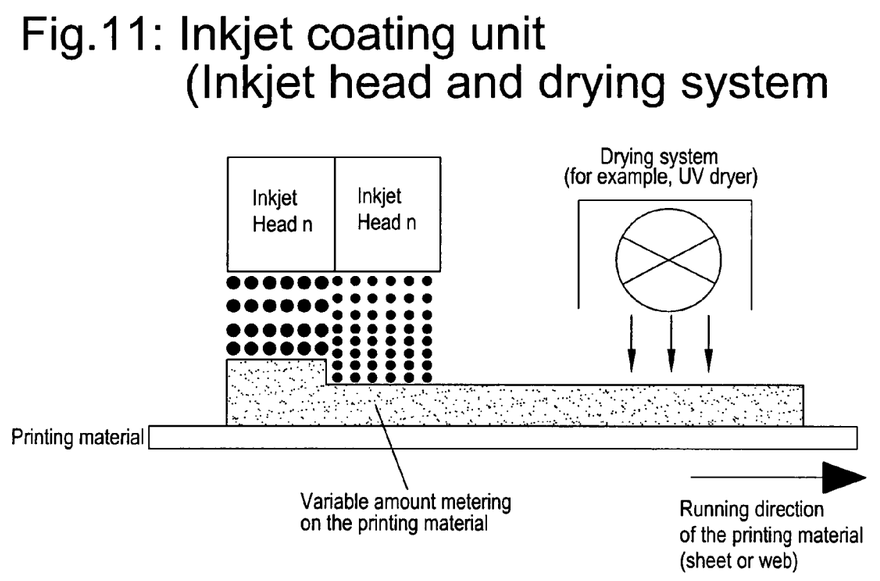
FIG. 11 is a schematic view of a coating unit according to the present invention wherein the coating unit is incorporated with a drying unit.

In a preferred embodiment, the inkjet coating unit can comprise a combination of the inkjet head arrays or the inkjet head bar and a drying unit that dries the liquid coating material (for example, UV varnish) on the printed product after it is applied(see, e.g., FIG. 11). As will be appreciated by those skilled in the art, the drying unit can be omitted if special varnishes are used that do not have to be dried. However, in a typical case, the drying process is intended to enable the further processing of the coated printed products. The drying unit can be a UV dryer if, for example, UV varnish is used as coating material. The drying unit should be adapted to the particular coating material being used or be suitable for drying the liquid material. For example, hot-air or infrared dryers are suitable for the use of aqueous materials.

Figure 3:
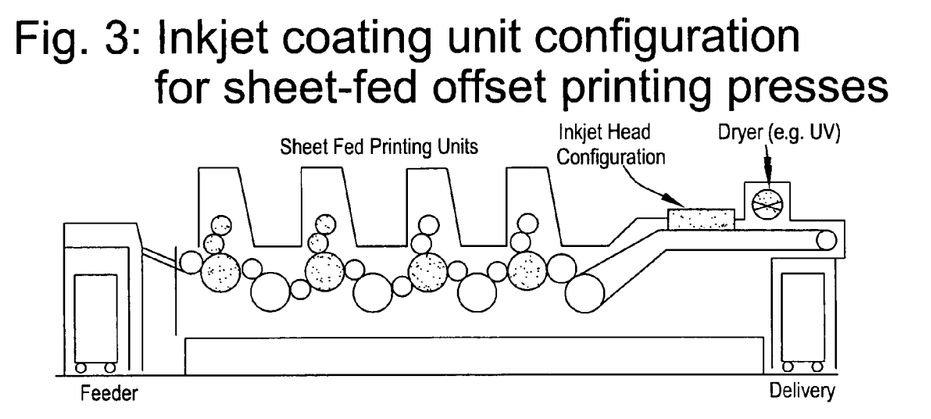
FIG. 3 is a schematic view of a coating unit according to the present invention incorporated into a sheet-fed offset printing press.
Figure 4:
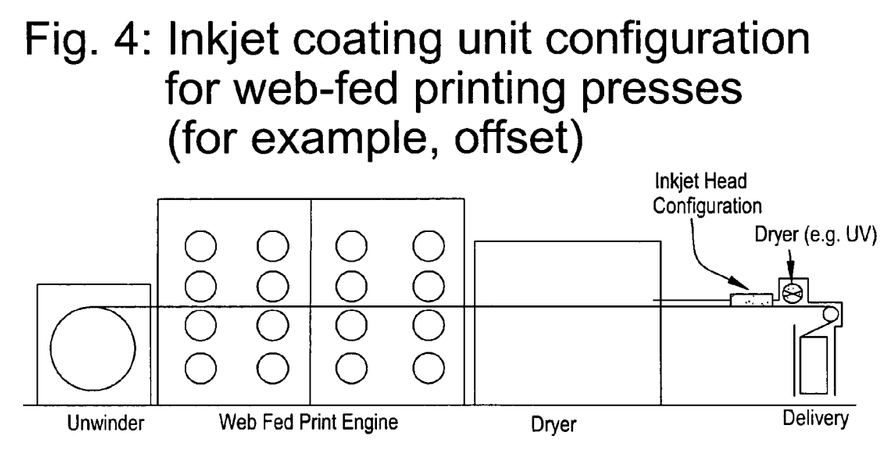
FIG. 4 is a schematic view of a coating unit according to the present invention incorporated into a web-fed printing press.

The inkjet coating unit of the present invention can be integrated into a variety of different printing machines. For example, the inkjet coating unit of the present invention can be integrated into sheet-fed offset printing presses. In such a case, the inkjet coating unit can be arranged at the sheet delivery end of the sheet-fed printing press as shown in FIG. 3. The inkjet coating unit of the present invention also can be integrated into web-fed offset printing presses. In particular, the coating unit can be arranged at the web delivery end of the web-fed printing press as shown in FIG. 4.

Figure 5:
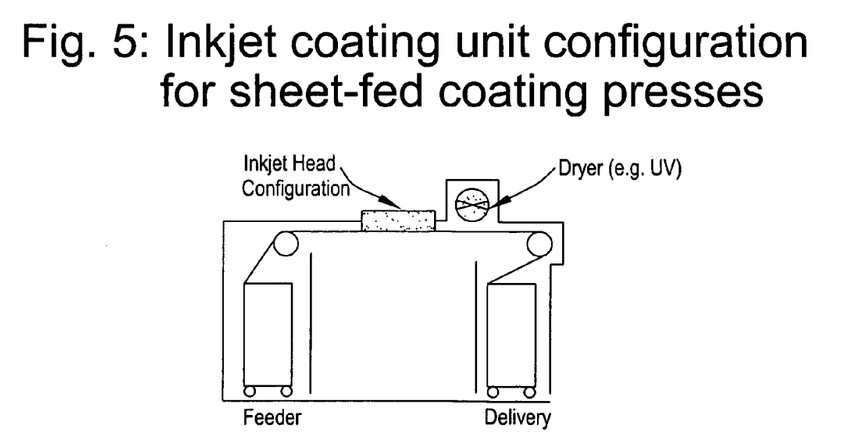
FIG. 5 is a schematic view of a coating unit according to the present invention incorporated into a sheet-fed coating press.

In addition, the inkjet coating unit can be integrated into sheet-fed coating presses. For example, the coating unit can be arranged at the sheet delivery end of the sheet-fed printing press as shown in FIG. 5.

Figure 6:
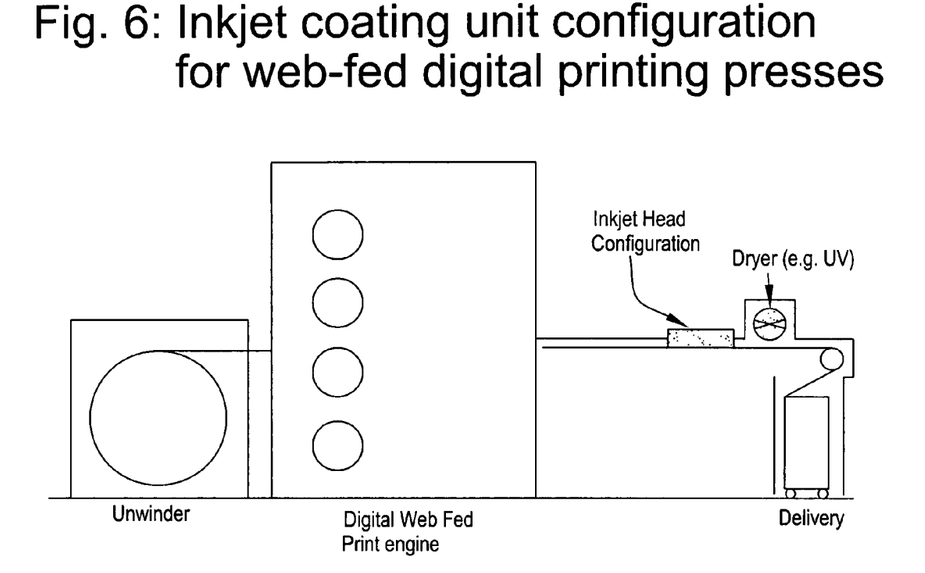
FIG. 6 is a schematic view of a coating unit according to the present invention incorporated into a web-fed digital printing press.
Figure 7:
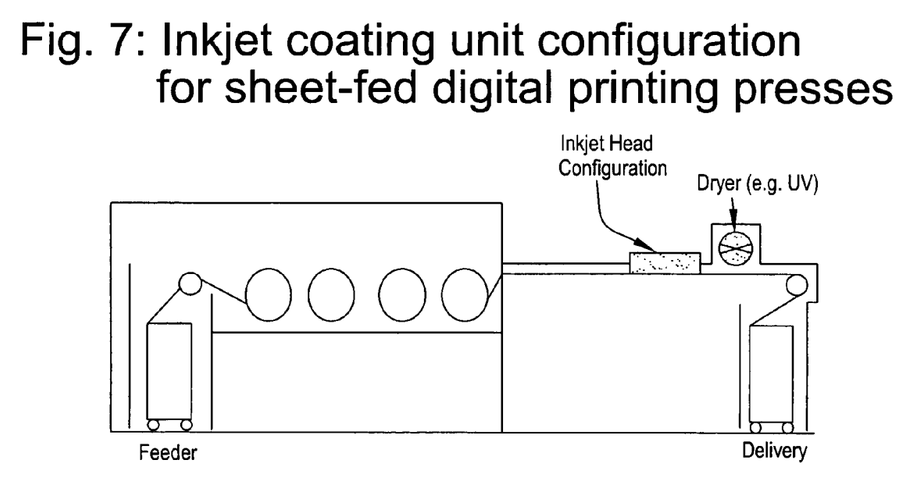
FIG. 7 is a schematic view of a coating unit according to the present invention incorporated into a sheet-fed digital printing press.

The inkjet coating unit can be limited to applications involving the coating of printed products. The inkjet coating unit of the present invention also can be integrated into web-fed digital printing presses. In such a case, the coating unit can be arranged at the web delivery end of the web-fed digital printing press as shown in FIG. 6. Additionally, the inkjet coating unit can be integrated into sheet-fed digital printing presses. In such a case, the coating unit should be arranged at the sheet delivery at the end of the sheet-fed digital printing press as shown in FIG. 7.

Figure 10:
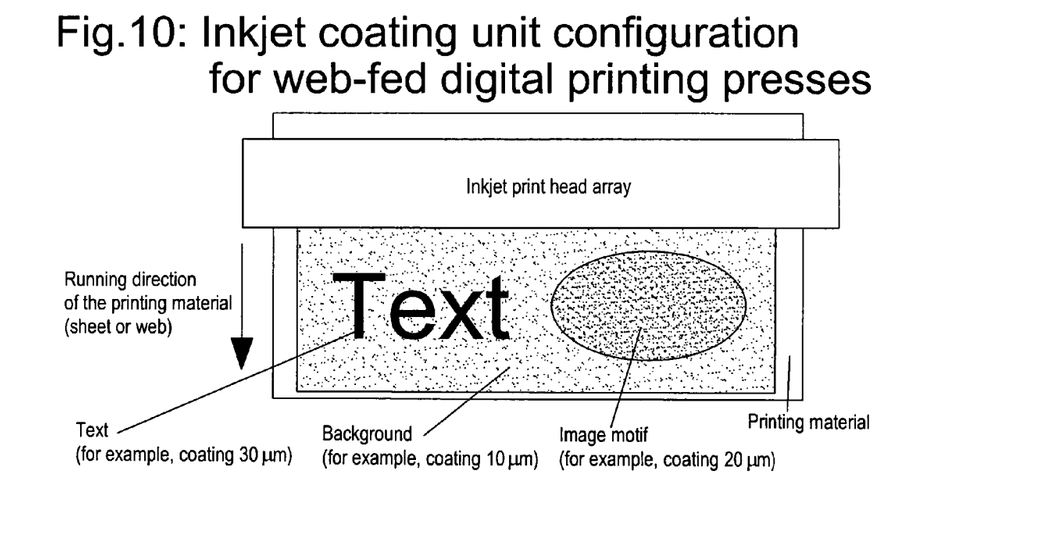
FIG. 10 is a schematic view illustrating an inkjet coating applied by a coating unit according to the present invention with variable layer profiles on the printed material.

The inkjet heads of the inkjet coating unit of the present invention can be actuated via a control unit (for example, an image data computer) by means of digital image data. The distribution of the coating material (for example, varnish) can be varied both in terms of the area (for example, image motifs, text or backgrounds) as shown in FIG. 10 and in terms of the layer profile (for example, the varnish film thickness or layer thickness of the medium).

Figure 8:
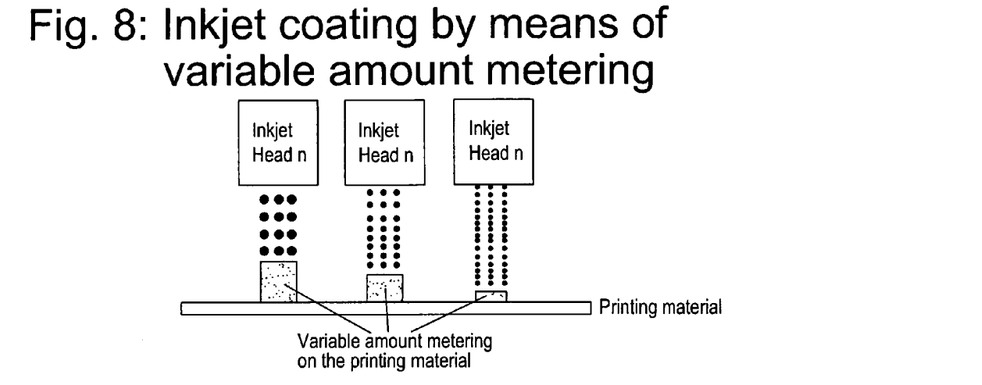
FIG. 8 is a schematic view illustrating an inkjet coating applied by a coating unit according to the present invention with a variable amount of metering.
Figure 9:
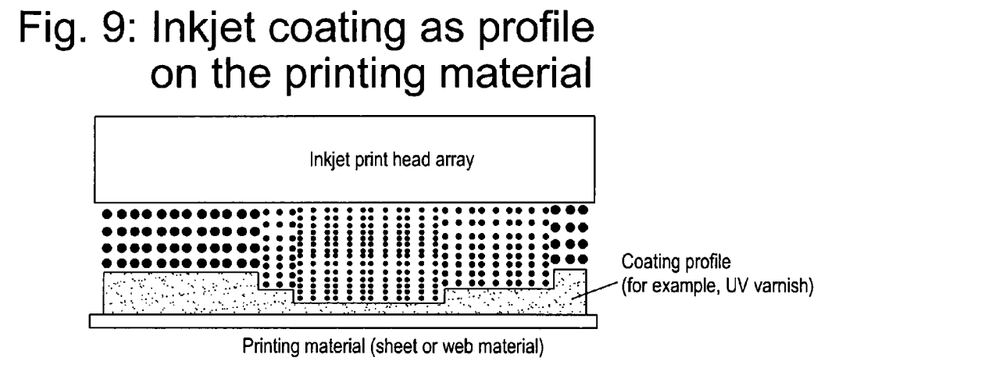
FIG. 9 is a schematic view illustrating an inkjet coating applied by a coating unit according to the present invention with a layer profile on the printed material.

Moreover, it is possible to modify the droplet characteristics of the inkjet heads of the coating unit of the present invention. The coating result can be both complete area coverage having the greatest layer thickness and the absence of any coating (for example, no varnish application or spot coating). The distribution of the coating medium (for example, varnish) can be varied in an infinitely adjustable manner as desired in terms of the area and layer profile as illustrated in FIGS. 8 and 9.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A device for producing a coating on a printed material that has been printed in a printing press, the coating device comprising a separate inkjet printer for discharging a coating material on the printed material, the inkjet printer comprising an array of inkjet heads, the inkjet printer including a plurality of inkjet outlet openings arranged to act in a line-by-line manner on the printed material which is passed under the inkjet outlet openings, and a control unit for actuating discharge of coating material through the inkjet outlet openings of the inkjet printer using digital image data such that distribution of the coating material on the printed material is variable in terms of a surface area of the printed material and in terms of a layer profile and wherein the droplet characteristics of the coating material discharged through the inkjet outlet openings is variable by the control unit such that the coating material applied on the printed material is variable between complete area coverage on the printed material and the absence of any coating material.

2. The coating device according to claim 1, further including a dryer arranged directly after the inkjet printer in a transport direction of the printed material for drying the coating material on the printed material after the coating material is applied by the inkjet printer.

3. The coating device according to claim 2, wherein the inkjet printer is adapted to apply a UV varnish as the coating material and the dryer is a UV dryer.

4. The coating device according to claim 2, wherein the inkjet printer is adapted to apply an aqueous material as the coating material and the dryer is a hot-air dryer.

5. The coating device according to claim 1, wherein the printing press is a rotary press.

6. The coating device according to claim 1, wherein the printing press is a digital, image data-oriented printing press.

7. The coating device according to claim 2, wherein the inkjet printer is adapted to apply an aqueous material as the coating material and the dryer is an infrared dryer.

8. A device for producing a coating on a printed material that has been printed in a printing press, the coating device comprising a separate inkjet printer for discharging a coating material on the printed material, the inkjet printer comprising an inkjet bar, the inkjet printer including a plurality of inkjet outlet openings arranged to act in a line-by-line manner on the printed material which is passed under the inkjet outlet openings, and a control unit for actuating discharge of coating material through the inkjet outlet openings of the inkjet printer using digital image data such that distribution of the coating material on the printed material is variable in terms of a surface area of the printed material and in terms of a layer profile and wherein the droplet characteristics of the coating material discharged through the inkjet outlet openings is variable by the control unit such that the coating material applied on the printed material is variable between complete area coverage on the printed material and the absence of any coating material.

9. The coating device according to claim 8, further including a dryer arranged directly after the inkjet printer in a transport direction of the printed material for drying the coating material on the printed material after the coating material is applied by the inkjet printer.

10. The coating device according to claim 9, wherein the inkjet printer is adapted to apply a UV varnish as the coating material and the dryer is a UV dryer.

11. The coating device according to claim 9, wherein the inkjet printer is adapted to apply an aqueous material as the coating material and the dryer is a hot-air dryer.

12. The coating device according to claim 8, wherein the printing press is a rotary press.

13. The coating device according to claim 8, wherein the printing press is a digital, image data-oriented printing press.

14. The coating device according to claim 9, wherein the inkjet printer is adapted to apply an aqueous material as the coating material and the dryer is an infrared dryer.

* * * * *